United States Patent
Biswal

(10) Patent No.: US 6,810,507 B2
(45) Date of Patent: Oct. 26, 2004

(54) METHOD AND APPARATUS FOR ISOLATING THE ROOT OF INDETERMINATE LOGIC VALUES IN AN HDL SIMULATION

(75) Inventor: Krutibas Biswal, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 94 days.

(21) Appl. No.: 10/109,522

(22) Filed: Mar. 28, 2002

(65) Prior Publication Data

US 2003/0135838 A1 Jul. 17, 2003

Related U.S. Application Data

(60) Provisional application No. 60/349,779, filed on Jan. 17, 2002.

(51) Int. Cl.[7] .................................................. G06F 17/50
(52) U.S. Cl. ............................................. 716/4; 703/13
(58) Field of Search ................................. 716/1, 4, 5, 6, 716/7, 18; 703/13, 14, 17, 20, 15, 16; 714/724, 741

(56) References Cited

U.S. PATENT DOCUMENTS

| 6,336,087 B2 | * | 1/2002 | Burgun et al. ............... 703/15 |
| 6,470,478 B1 | * | 10/2002 | Bargh et al. ................ 716/4 |
| 6,487,704 B1 | * | 11/2002 | McNamara et al. .......... 716/5 |
| 6,571,375 B1 | * | 5/2003 | Narain et al. ............... 716/5 |
| 2003/0074644 A1 | * | 4/2003 | Mandell et al. .............. 716/7 |

* cited by examiner

Primary Examiner—Leigh M. Garbowski
(74) Attorney, Agent, or Firm—Martine & Penilla, LLP

(57) ABSTRACT

A technique for simulating and verifying an integrated circuit design are disclosed. Generally speaking, the technique includes storing a unique identifier for the cell generating a root unknown value along with the root unknown value in the results of the simulation. In some embodiments, the same may be done for derived unknown values along with the unique identifier for the root unknown value giving rise to the derived unknown value.

30 Claims, 4 Drawing Sheets

METHOD AND APPARATUS FOR ISOLATING THE ROOT OF INDETERMINATE LOGIC VALUES IN AN HDL SIMULATION

The earlier effective filing date of U.S. Provisional Application Ser. No. 60/349,779, filed Jan. 17, 2002, in the name of Krutibas Biswal and entitled, "Method and Apparatus for Isolating the Root of Indeterminate Logic Values in an HDL Simulation," and commonly assigned herewith, is hereby claimed.

BACKGROUND OF THE INVENTION

1. Field of the Invention

This invention relates to circuit design verification systems, and, in particular, to a method and apparatus for verifying that the design of electronic circuits meets user specified operational correctness and performance criteria.

2. Description of the Related Art

Increases in precision, accuracy, and sophistication of fabrication techniques permit the design and manufacture of incredibly complex, large scale integrated circuits ("ICs"). Not surprisingly, the resulting complexity and scale is reflected in the design effort for such ICs. The design effort typically involves many circuit designers and many iterations before a final design is ready for production. Various designs are proposed, tested, and modified. Each design is tested for bugs and for performance (i e., speed), and modified accordingly to remove bugs and/or improve performance. Ultimately, a design is deemed sufficiently bug-free and fast to be frozen and converted to hardware. Thus, one reason for the many iterations is to arrive at a design as good and complete as is reasonably possible.

One part of the design process is to "verify," ie., test, that the design works acceptably. Verifying the correctness of complex ICs can be a difficult and complicated task. Various software representations of the IC design are employed during development. Typically, a logical representation of the IC is provided in a hardware design language ("HDL") such as Verilog or VHDL. This representation is, in fact, a computer based model—an inchoate description of the IC hardware for a design proposed in a particular iteration. Ultimately, when the IC design is frozen, the HDL representation is converted to an arrangement of gates capable of implementing the IC logic on a semiconductor chip.

More particularly, the IC is represented by a list of statements in an HDL. This list of statements is referred to as the HDL circuit "specification" or "description." The HDL circuit description is then converted into a specific circuit "netlist." The netlist comprises a list of circuit components and the interconnections between those components. Circuit components are also known as "cells," where each cell in a specific circuit library has both a logical representation, as well as a circuit layout representation.

The netlist defines all of the interconnections between the components of the circuit. Each "signal" which interconnects two or more cells, or which represents an input or output for the entire circuit, is actually a node in the circuit which has been assigned a name. Many circuits receive input signals on more than one input terminal, and produce output signals only after multiple required input signal changes have occurred on multiple input terminals. Usually, the time at which the output signal occurs depends not only upon the arrival time of the latest required input signal, but also upon the prior arrival times of other required input signals. In conventional circuit analysis and design, simple models are used that represent circuit operation as providing the output signal after a fixed delay following the arrival of the last required input signal. The terms "net," "signal" and "node" are sometimes used interchangeably. In addition, the netlist specifies the nature of its components by specifying a cell name for each component. The cell name, in turn, specifies or points to a particular circuit in a predefined library of cells.

In fact, complex custom ICs are often designed by engineers at the "HDL level" and are specified by those engineers for simulation and verification purposes using an HDL circuit description such as a Verilog language circuit description. To create the conditions used to detect defects in a circuit design, highly parallel but well-controlled verification programs are written. In such programs, test patterns are applied to the input ports in the HDL circuit description and signals at the output ports are observed over time to determine whether the inputs were transformed into the expected outputs. The HDL circuit description is sometimes referred to as the "device under test" ("DUT"). Thus, the DUT is "surrounded" with a layer of code that performs the stimulus generation and output comparisons. This layer of code, often referred to as a "test bench," can be very simple or as complex as necessary for the application at hand.

In current approaches, one difficulty in creating complex test benches arises when there are many types of events that are not expected to happen at specific times, but rather "some time" within a certain relationship to other events. For example, in a bus transaction, a designer might send a request and want to have it acknowledged within a certain window of time. However, whether the reply comes within 2 or 20 cycles might be irrelevant. Similarly, an arbiter may assign a given resource in ways that are difficult to predict and may not matter. What will actually matter is that in the end all the requests presented to the arbiter for servicing are satisfied by the arbiter and that the ordering satisfies a specified general policy.

These two examples reflect a common problem in the verification of complex circuits, namely that the inherently parallel nature of complex electronic circuits results in time and ordering ambiguities or uncertainties. The circuit simulator on which the HDL circuit netlist description is being verified traces the various signals that propagate through the model when the test bench is performed. The circuit simulator will generate a "1" (logic high), "0" (logic low), "Z" (tristate), or "X" (unknown) value for a given signal at a given time. The "X" values arise from these ordering ambiguities and uncertainties. For instance, an "X" value may be caused by failure to meet timing constraints (e.g., set-up and hold times), or by the receipt of an "X" input signal. The "X" value then propagates downstream to other cells, generating still more "X" values in a "logic cone" extending from the first cell, until they appear at the primary outputs of the circuit simulator.

These unknowns are a serious problem to the circuit designers because an unknown implies that the resulting output is unpredictable. Circuit designers, therefore, have to explain the source of each unknown so that it can be fixed in the next design iteration. Circuit designers typically use debugging tools of simulation waveform dumps (of the signals) to find the source of these unknowns. This frequently involves tracing back through the model to examine the internal states of the nodes of the circuits during the test bench. The unknowns are traced back to the driven cells and all the nodes in the entire logic cone have to be examined to find the origin, or source, of the first unknown.

Thus, state of the art tools available for isolating the root of these unknown values do not offer any quick or convenient ways to accomplish this identification. In a sense, the state of the art still employs a brute force approach—checking all signal drivers and their logic values throughout the entire logic cone. This is especially difficult since the logic cone is defined by the root, which is still unknown at the time. This can be a tedious and time consuming task for state of the art IC design netlists where the number of logic levels leading to the root of a logic cone is very high.

SUMMARY OF THE INVENTION

In its various aspects and embodiments, the invention includes a method and apparatus for simulating and verifying an integrated circuit design.

In first aspect, the invention includes a circuit simulation system for use in verifying a design of an integrated circuit. The circuit simulator comprises a test bench, an HDL circuit specification of the integrated circuit design, at least one circuit model for use in implementing the HDL circuit specification, and a circuit simulator. The circuit simulator includes a simulation engine and at least one data structure. The simulation engine is capable of simulating the integrated circuit design from the HDL circuit specification in accordance with the test bench. The data structure is for use in simulating the integrated circuit design and includes a root unknown value and a unique identifier for a root cell generating the root unknown value.

In a second aspect, the invention includes a method for isolating the root of unknown values in an HDL simulation. The method comprises simulating the operation of an integrated circuit; tracking a plurality of values of a plurality of signals during the simulation; and marking a root unknown value with a unique identifier for a root cell generating the root unknown value as the root unknown value is tracked.

In other aspects, the invention includes a program storage medium encoded with instructions and/or a computing device programmed with such instruction to perform the method, either by using such a simulation circuit or some other simulation circuit.

BRIEF DESCRIPTION OF THE DRAWINGS

The invention may be understood by reference to the following description taken in conjunction with the accompanying drawings, in which like reference numerals identify like elements, and in which.

Figure 1A:
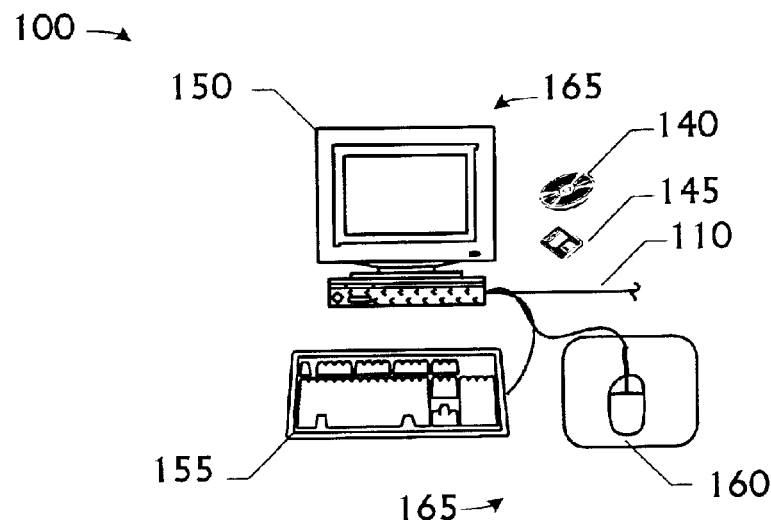
FIG. 1A depicts an electronic computing device programmed and operated in accordance with one particular embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1B:
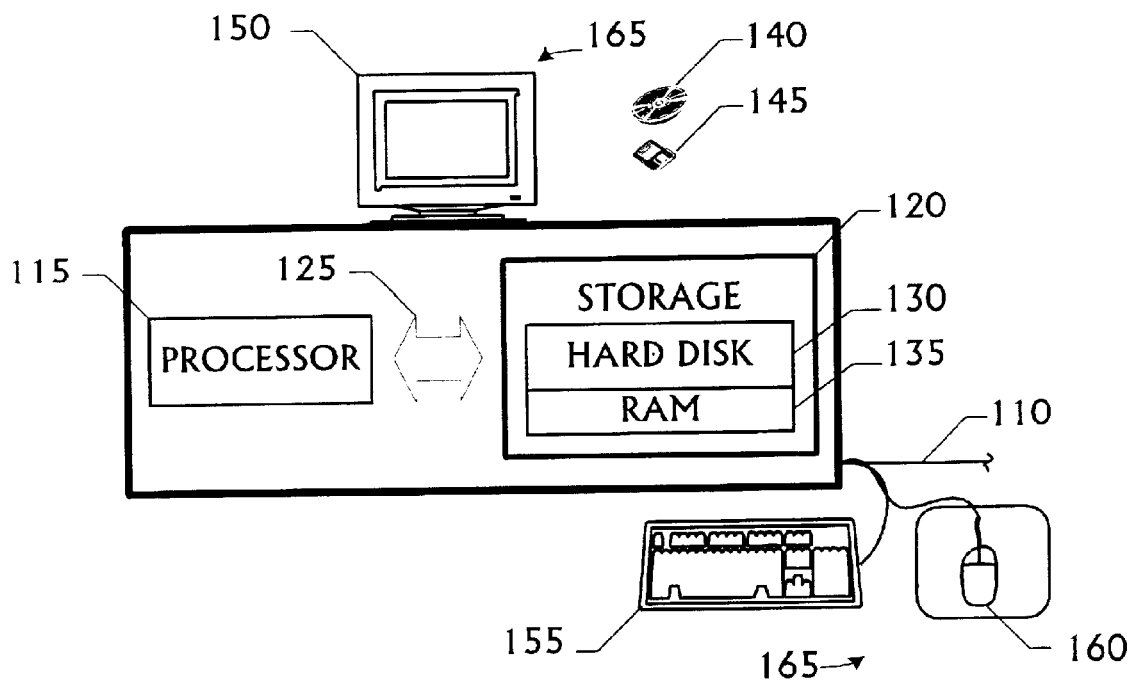
FIG. 1B conceptually illustrates the hardware architecture of the electronic computing device of FIG. 1A in a partial block diagram.

FIG. 1A depicts a computing device 100 programmed and operated in accordance with the present invention. The hardware architecture of the computing device 100 relevant to the present invention is illustrated in FIG. 1B. Some aspects of the hardware and software architecture (e.g., the individual cards, the basic input/output system ("BIOS"), input/output drivers, etc.) are not shown. These aspects are omitted for the sake of clarity, and so as not to obscure the present invention. As will be appreciated by those of ordinary skill in the art having the benefit of this disclosure, however, the software and hardware architectures of the computing device 100 will include many such routine features.

In the illustrated embodiment, the computing device 100 is a Sun UltraSPARC workstation (e.g., the Sun Blade™ or the Ultra™ line of workstations) employing a UNIX-based operating system (e.g., a Solaris™ OS) commercially available from the assignee of this application, Sun Microsystems, Inc. However, the invention is not so limited. The computing device 100 may be implemented in virtually any type of electronic computing device such as a laptop computer, a desktop computer, a mini-computer, a main-frame computer, or a supercomputer. The computing device 100 may also be part of a larger computing system by a connection over the line 110. Exemplary computing systems in such an implementation would include local area networks ("LANs"), wide area networks ("WANs"), system area networks ("SANs"), intranets, or even the Internet. Alternative operating systems (e.g., Windows™-based or disk operating system ("DOS")-based) may also be employed.

The computing device 100 also includes a processor 115 communicating with some storage 120 over a bus system 125. The storage 120 will typically include at least a hard disk 130 and some random access memory ("RAM") 135. The computing device 100 may also, in some embodiments, include removable storage such as an optical disk 140, or a floppy electromagnetic disk 145, or some other form such as a magnetic tape or a zip disk (not shown). The processor 115 may be any suitable processor known to the art. For instance, the processor may be a microprocessor or a digital signal processor ("DSP"). In the illustrated embodiment, the processor 115 is an UltraSPARC™ 64-bit processor available from Sun Microsystems, but the invention is not so limited. The microSPARC™ from Sun Microsystems, any of the Itanium™ or Pentium™-class processors from Intel Corporation, the Athlon™ or Duron™ class processors from Advanced Micro Devices, Inc., and the Alpha™ processor from Compaq Computer Corporation might be employed. The computing device 100 includes a monitor 150, keyboard 155, and a mouse 160, which together, along with their associated user software (not shown in FIG. 1A, FIG. 1B) comprise a user interface 165.

Figure 2A:
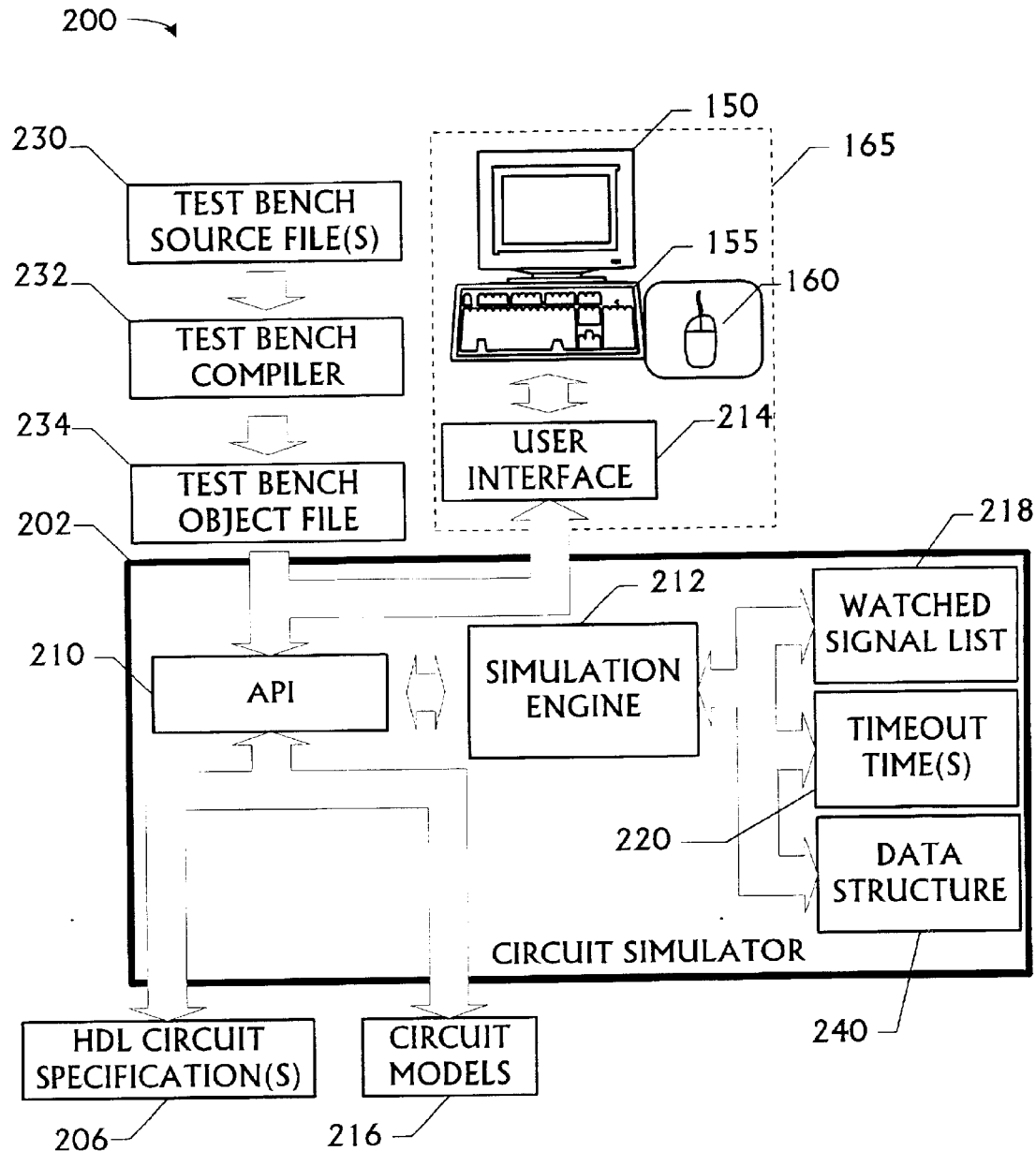
FIG. 2A conceptually illustrates the functional relationship of selected portions of the software architecture of the electronic computing device.

Referring to FIG. 2A, there is shown a circuit simulation system 200 employing the computing device 100 of FIG. 1A, FIG. 1B in accordance with the present invention. An HDL circuit simulator 202 simulates the operation of an electronic circuit specified with an HDL level circuit specification 206. Since the operation of HDL circuit simulators is well documented and well known to those of ordinary skill in the art of electronic circuit simulation, only the few aspects of such simulators most relevant to the present invention are provided in this document. Again, the omitted aspects are not shown for the sake of clarity, and so as not to obscure the present invention. The HDL circuit simulator 202 also includes an application program interface ("API") 210 that enables other programs to interact with the HDL circuit simulator 202 through the use of pre-established instructions (actually procedure calls).

The HDL circuit simulator 202 of the illustrated embodiment is a Verilog or VHDL HDL circuit simulator modified to implement the present invention. It is noted here that HDL circuit simulators are "Boolean logic circuit simulators" in which all signals in the simulated circuit are defined to have logical values, at each point in time. These logical values are equal to one of a small set of predefined values, typically including 0, 1, Z, and X, as was discussed above.

The HDL circuit simulator 202 also includes a simulation engine 212 that simulates the operation of the circuit specified by the HDL circuit specification 206. The HDL circuit specification 206 is originally received via a software user interface 214 of the user interface 165 that handles communications with a circuit designer. The simulation engine 212 simulates the operation of specific circuit components in accordance with predefined circuit models 216, typically stored in a library of such models. The circuit models 216 define not only the functionality of the circuit components, but also the time domain and frequency domain transfer characteristics of each circuit component when manufactured using a particular circuit manufacturing process.

The performance of the circuit in the HDL circuit specification 206 as simulated by the simulation engine 212 is also determined by the waveforms of the specified circuit's input signals. The term "waveform," as used herein, means a sequence of values associated with a signal over a period of time, or equivalently, a sequence of one or more changes in the value of a signal over a period of time. The input signal waveforms can be specified by the user via the user interface 165, or can be specified through the API 210 through the use of predefined procedure calls for defining input signal waveforms, i.e., the "test bench." The test bench is input as a test bench source file 230 that is compiled on the test bench compiler 232 to generate the test bench object file 234.

Data structures supported by the HDL circuit simulator 202 that are utilized by the circuit verification subsystem 204 include a watched signal list 218, a set of one or more timeout values 220, and a data structure 240. The watched signal list 218 is comprised of a list of signals in the simulated circuit. More specifically, the watched signal list 218 is a list of all circuit signals whose values are relevant to the operational correctness and performance criteria that are currently being monitored by the circuit verification subsystem. The simulation engine 212 stops the simulation of the specified circuit whenever any signal in the watched signal list 218 changes value. When the simulation engine 212 reaches a specified timeout value 220, the simulation stops and control is returned to the system's user via the user interface 165. The data structure 240 is used to store the results of the simulation in accordance with the invention in a fashion described more fully below.

Each distinct "circuit verification test procedure" is called a "test bench." While a test bench can be simple or complex in structure, the primary functions of a test bench are: to specify input signal waveforms, to specify operational correctness and performance criteria, and to specify operations to be performed when various ones of the operational correctness and performance criteria are satisfied or are breached. As mentioned above, each test bench is initially prepared as a test bench source file 230, which is then processed by a test bench compiler 232 so as to generate an executable test bench object file 234.

Figure 3:
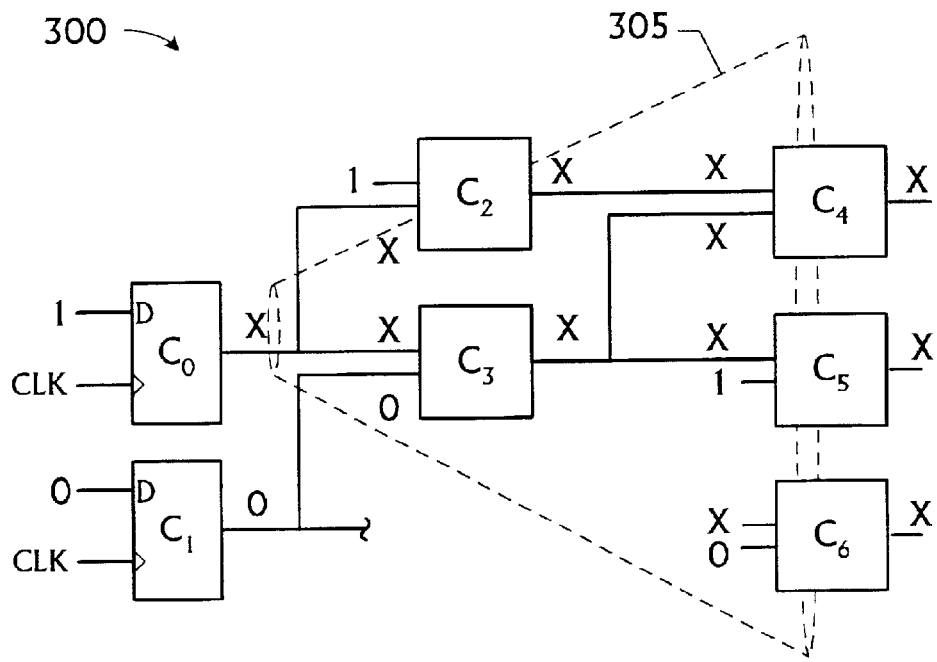
FIG. 3 illustrates one particular portion of an exemplary circuit design for an integrated circuit to be verified.

Turning now to FIG. 3, a portion 300 of an integrated circuit design netlist to be verified is illustrated. The portion 300 includes seven cells $C_0$–$C_6$. In the illustrated embodiment, the cells $C_0$, $C_1$ happen to be flip-flops. The cells $C_2$–$C_6$ are shown as boxes to convey that they may be virtually any logic gate, e.g., OR, AND, XOR, or any other Boolean function. However, the invention is not so limited. Note that the portion 300 is exemplary only. The invention may be practiced on virtually any logic circuit that may be described in an HDL specification. For instance, all of the cells $C_0$–$C_6$ may be AND gates in one particular implementation.

TABLE 1

| Cell Inputs and Outputs | | |
|---|---|---|
| Cell | Inputs | Output |
| $C_0$ | 1, ↑ | X |
| $C_1$ | 0, ↑ | 0 |
| $C_2$ | 1, X | X |
| $C_3$ | X, 0 | X |
| $C_4$ | X, X | X |
| $C_5$ | X, 1 | X |
| $C_6$ | X, 0 | X |

Note that the inputs to the cells $C_0$ and $C_1$ are determinate, i.e., they are all 1's or 0's. The cell $C_0$, however, has a setup (or hold) violation resulting in an indeterminate, or "unknown," output X. Since the inputs to the cell $C_0$ are determinate while its output is indeterminate, the cell $C_0$ shall be referred to as a "root cell" and its indeterminate output a "root unknown value." Note also how the indeterminate output of the cell $C_0$ then becomes an input to the cells $C_2$ and $C_3$, causing their outputs to be indeterminate. This indeterminacy propagates through the logic cone 305, conceptually illustrated in broken lines. The cells $C_2$–$C_6$ will be referred to as "downstream" of the cell $C_1$ because the output of $C_1$ propagates to them. Unknown values generated by these downstream cells shall be referred to a "derived" or "derivative" unknowns, to differentiate them from root unknowns.

Figure 4:
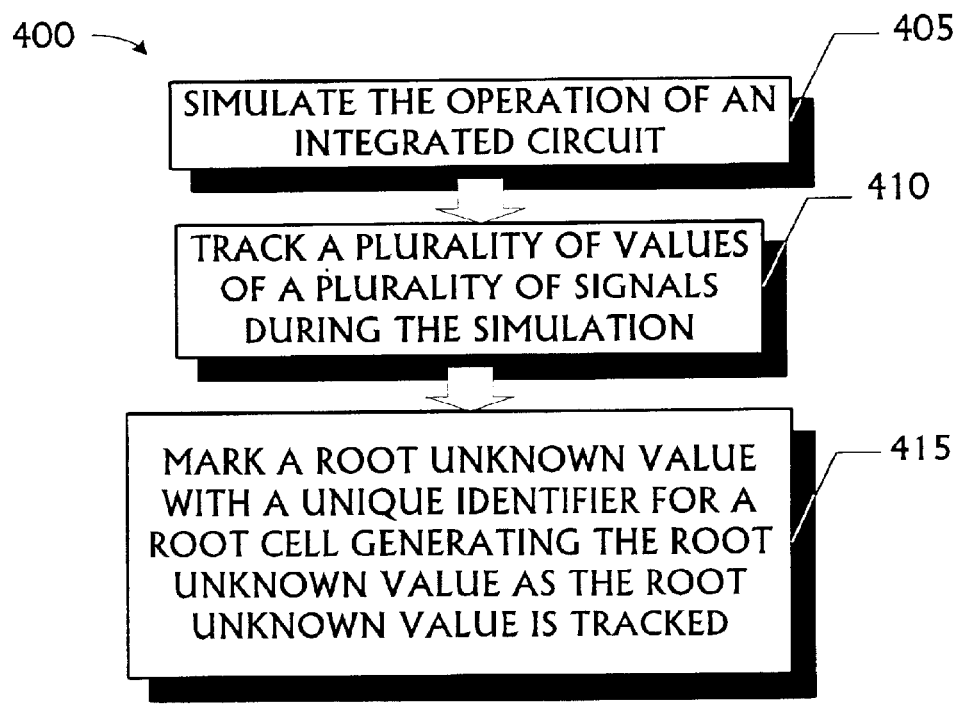
FIG. 4 illustrates one particular embodiment of a method practiced in accordance with the present invention.

FIG. 4 illustrates one particular embodiment of a method 400 practiced in accordance with the present invention. The method 400 is one for isolating the root of unknown values in an HDL simulation. The method 400 begins by simulating the operation of an integrated circuit, as set forth in the box

Figure 2B:
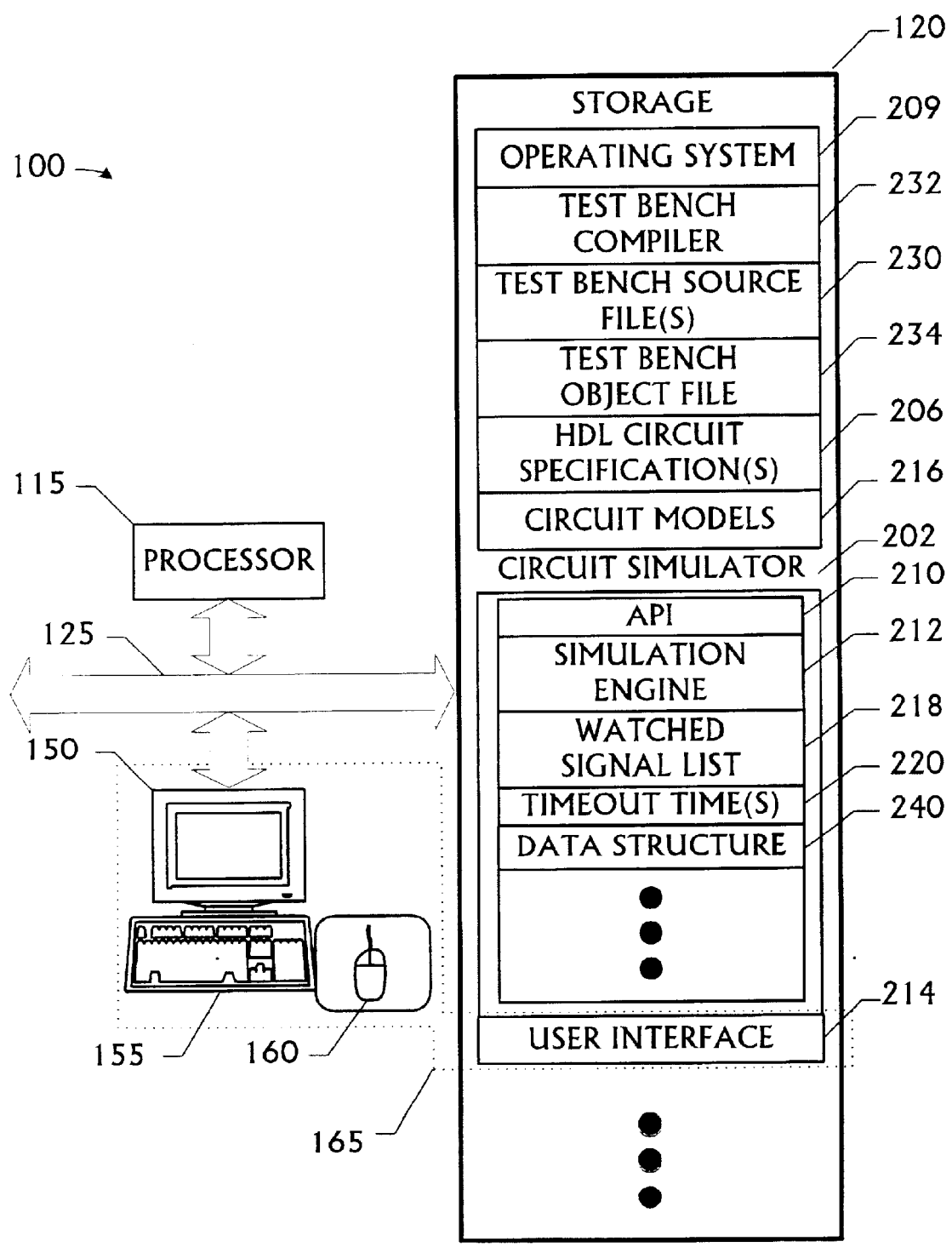
FIG. 2B conceptually illustrates the structural relationship of selected portions of the software and hardware architectures the electronic computing device of FIG. 1A.

405. Referring now to FIG. 2A and FIG. 2B, the processor 115 begins executing the circuit simulator 202, which accesses the test bench object file 234 through the API 210. The circuit simulator 202 then simulates the operation of the circuit design specified in the HDL circuit specification 206, incorporating the circuit models 216 according to the test bench object file 234.

This presumes that the test bench source file 230 has already been coded and compiled by the test bench compiler 232 into the test bench object file 234. This also assumes the HDL circuit specification 206 and circuit models 216 have already been coded. If not, these steps will need to be taken prior to invoking the method 400. The test bench 230, test bench compiler 232, test bench object file 234, HDL circuit specification 206, and circuit models 216 may be coded in conventional fashion using tools and techniques readily known to those skilled in the art. In the illustrated embodiment, all these components are encoded somewhere on the storage 120 of the computing device 100, as is best shown in FIG. 2B, although this is not necessary to the practice of the invention. For instance, the circuit model(s) 216 may reside and be accessed on a second computing device or removable storage.

Returning to FIG. 4, the method 400 then tracks a plurality of values of a plurality of signals during the simulation, as is set forth in the box 410. Tracking may simply involve the simulation engine 212 storing the values as a part of the results of the simulation in a data structure for that purpose, e.g., the data structure 240 shown in FIG. 2A, FIG. 2B. Data structures such as the data structure 240 are commonly used in an HDL circuit simulator to store the results of a simulation. However, in a departure from conventional practice, any root unknown value is marked with a unique identifier for a root cell generating the root unknown value as the root unknown value is tracked, as is set forth in the box 410. Note that there may be, and probably will be, more than one root unknown value in any given simulation. Each such root unknown value is marked with a unique identifier.

The nature of the unique identifier is not important to the practice of the invention so long as it permits unique identification of the root cell generating the root unknown value. For instance, the unique identifier may be an instance path, preferably a complete instance path, for the root cell. Alternatively, the root unknown value can be marked with a tag uniquely identifying it among all the simulated structures in the HDL specification. The approaches may also be used in conjunction. The point is to associate the root unknown value with some identifier uniquely identifying the root cell that generated it so that the root cell can be readily identified when the simulation results are examined.

Some alternative embodiments may track and mark derivative unknown values in a similar manner, i.e., marking the derivative unknown value with a unique identifier for the downstream cell that generates it. This may sometimes facilitate identification of the cause for a root unknown value, but will require additional overhead and computing resources. Such an embodiment may also associate the unique identifier of the root cell with the derived unknown value, as well. Indeed, some alternative embodiments might even track and mark every value in the simulation in this fashion.

The invention also permits variation in how the data structure 240 used to track and mark root unknown values is implemented. The data structure 240 may be implemented as a file, a list, a table, an array, a record, or a tree, depending on the implementation. The invention is not limited by the manner in which the data structure 240 is implemented.

Once the simulation is completed, the circuit designer (not shown) can examine the results via the user interface 165 and the API 210. The circuit designer can query the circuit simulator 202 regarding the source of root unknowns and the circuit simulator 202 can respond through the API 210 and the user interface 165 simply by checking the data structure 240 and displaying the stored information. In embodiments tracking derived unknown values, the downstream cells that generate those derived values can likewise be reported directly to the circuit designer. If this embodiment also marks the derived value with the unique identifier of the root cell, the circuit designer can quickly and easily determine or trace any unknown value to the root cell that defines the logic cone in which the unknown value is found.

As should be evident above, some portions of the detailed descriptions herein are consequently presented in terms of a software implemented process involving symbolic representations of operations on data bits within a memory in a computing system or a computing device. These descriptions and representations are the means used by those in the art to most effectively convey the substance of their work to others skilled in the art. The process and operation require physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantifies. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for isolating the root of unknown values in an HDL simulation, comprising:
   simulating the operation of an integrated circuit design;
   tracking a plurality of values of a plurality of signals during the simulation; and
   marking a root unknown value with a unique identifier for a root cell generating the root unknown value as the root unknown value is tracked.

2. The method of claim 1, wherein tracking the plurality of values includes maintaining a data structure including the plurality of values and a unique identifier for the cells generating each respective one of the plurality of values.

3. The method of claim 2, further comprising instantiating the data structure.

4. The method of claim 1, wherein marking the root unknown value includes storing the unique identifier in a data structure associating the unique identifier with the root cell.

5. The method of claim 4, further comprising instantiating the data structure.

6. The method of claim 1, wherein marking the root unknown value with the unique identifier includes marking the root unknown value with an instance path of the root cell.

7. The method of claim 6, where marking the root unknown value with the instance path includes marking the root unknown value with a complete instance path.

8. The method of claim 1, wherein marking the root unknown value with the unique identifier includes marking the root unknown value with a unique tag of the root cell.

9. The method of claim 1, further comprising marking a downstream unknown value derived from the root unknown value as a derived unknown value.

10. The method of claim 9, wherein marking the derived unknown value includes storing the unique identifier for the root cell in a data structure associating the unique identifier for the root cell with the derived unknown value.

11. The method of claim 9, wherein marking the derived unknown value with the unique identifier of the root cell includes marking the derived unknown value with an instance path of the root cell.

12. The method of claim 11, where marking the derived unknown value with the instance path includes marking the derived unknown value with a complete instance path.

13. The method of claim 9, wherein marking the derived unknown value with the unique identifier of the root cell includes marking the derived unknown value with a unique tag of the root cell.

14. The method of claim 9, further comprising marking the derived value with a unique identifier for a downstream cell generating the derived value.

15. The method of claim 1, further comprising obtaining a test bench for the simulation.

16. The method of claim 1, wherein obtaining the test bench includes:
   coding a test bench source file; and
   compiling the test bench source file to obtain a test bench object file.

17. The method of claim 1, further comprising debugging the simulation results.

18. The method of claim 17, further comprising querying for the unique identifier of the root cell generating the root unknown value.

19. A computer readable, program storage medium encoded with instructions that when executed by a computer, perform a method for isolating the root of unknown values in an HDL simulation, the method comprising:
   simulating the operation of an integrated circuit design;
   tracking plurality of values of a plurality of signals during the simulation; and
   marking a root unknown value with a unique identifier for a root cell generating the root unknown value as the root unknown value is tracked.

20. The computer readable, program storage medium of claim 19, wherein tracking the plurality of values in the encoded method includes maintaining a data structure including the plurality of values and a unique identifier for the cells generating each respective one of the plurality of values.

21. The computer readable, program storage medium of claim 19, wherein marking the root unknown value in the encoded method includes storing the unique identifier in a data structure associating the unique identifier with the root cell.

22. The computer readable, program storage medium of claim 19, wherein marking the root unknown value with the unique identifier in the encoded method includes marking the root unknown value with an instance path of the root cell or with a unique tag of the root cell.

23. The computer readable, program storage medium of claim 19, wherein the encoded method further comprises marking a downstream unknown value derived from the root unknown value as a derived unknown value.

24. The computer readable, program storage medium of claim 19, wherein the encoded method further comprises obtaining a test bench for the simulation.

25. An apparatus programmed to perform a method for isolating the root of unknown values in an HDL simulation, the apparatus comprising:
   means for simulating the operation of an integrated circuit design;
   means for tracking a plurality of values of a plurality of signals during the simulation; and
   means for marking a root unknown value with a unique identifier for a root cell generating the root unknown value as the root unknown value is tracked.

26. The apparatus of claim 25, wherein the tracking means includes means for maintaining a data structure including the plurality of values and a unique identifier for the cells generating each respective one of the plurality of values.

27. The apparatus of claim 25, wherein the marking means includes means for storing the unique identifier in a data structure associating the unique identifier with the root cell.

28. The apparatus of claim 25, wherein the marking means includes means for marking the root unknown value with an instance path of the root cell or with a unique tag of the root cell.

29. The apparatus of claim 25, further comprising means for marking a downstream unknown value derived from the root unknown value as a derived unknown value.

30. The apparatus of claim 25, further comprising means for obtaining a test bench for the simulation.

* * * * *